June 12, 1951 E. S. PURINGTON 2,557,009

SELECTIVE AMPLIFIER SYSTEM

Filed Oct. 8, 1947

INVENTOR
ELLISON S. PURINGTON.
BY [signature] atty

Patented June 12, 1951 2,557,009

UNITED STATES PATENT OFFICE 2,557,009

SELECTIVE AMPLIFIER SYSTEM

Ellison S. Purington, Gloucester, Mass., assignor, by mesne assignments, to Radio Corporation of America, New York, N. Y., a corporation of Delaware Application October 8, 1947, Serial No. 778,684

8 Claims. (Cl. 179—171)

Figures 1, 2:
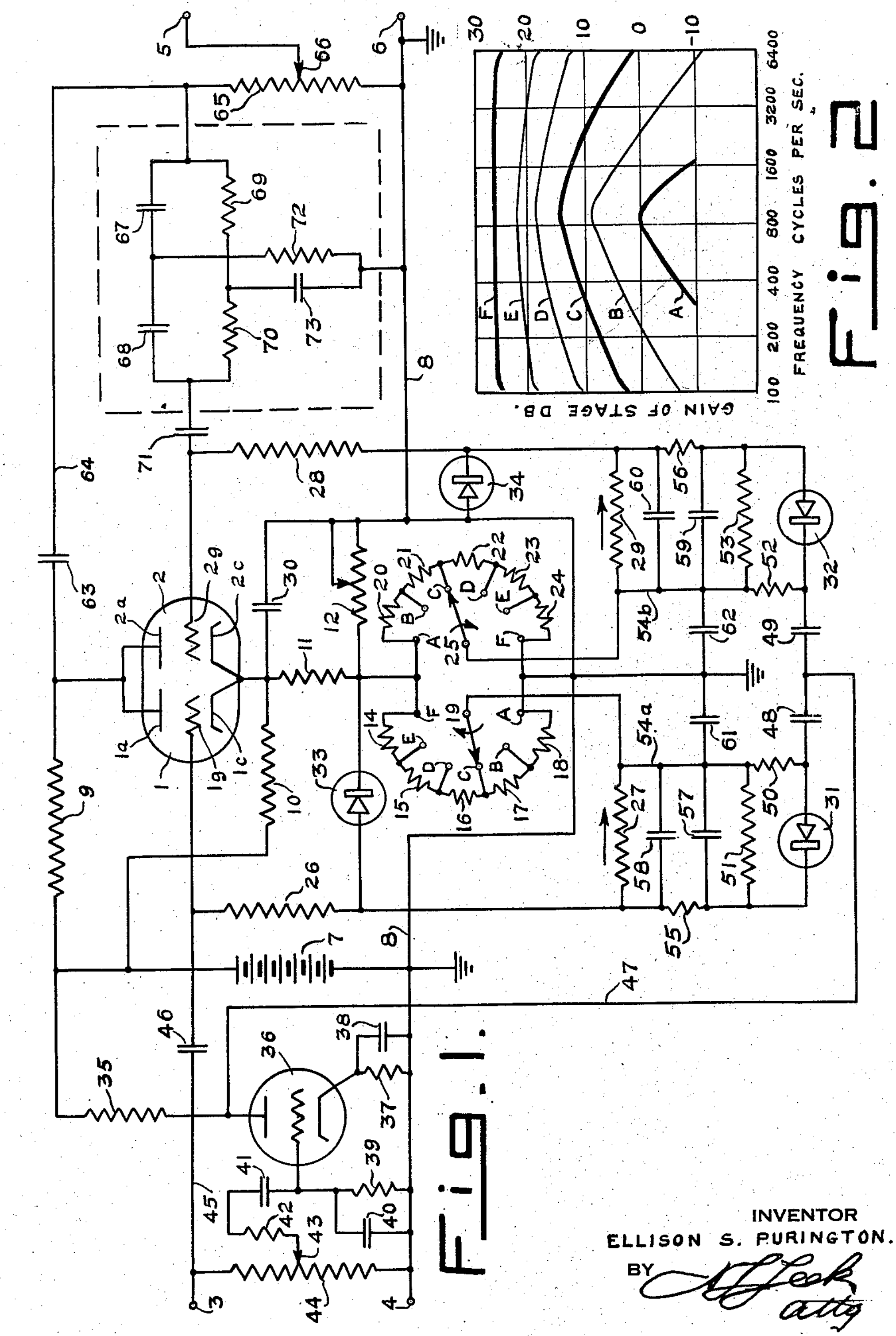

This invention relates to amplifiers, and has for an object to provide an amplifier in which the gain and frequency characteristics are altered in accordance with the nature of the input signal.

Another object is to provide an amplifier having volume expansion characteristics which vary in accordance with the frequency distribution and the volume level of the input signal.

Another object is to provide an amplifier system of the above type in which the change of gain with increase of volume is greatest for signals at the upper or lower ends of the audio frequency range.

Another object is to provide novel and improved manual and automatic control of the transmission characteristics of an amplifier.

Another object is to provide an amplifier of the above type for sound records, such as disc, wire or film, which will suppress background noise frequencies when the signal is not of sufficient strength to mask the presence of the background noises.

Another object is to eliminate thump and scratch noises in the output signal.

Various other objects and advantages will be apparent as the nature of the invention is more fully disclosed.

Although the novel features which are characteristic of this invention are pointed out more particularly in the claims, the nature of the invention will be better understood by referring to the following description, taken in connection with the accompanying drawings in which a specific embodiment thereof has been set forth for purposes of illustration.

In the drawings—

Fig. 1 is a schematic diagram of a manually and automatically controlled dynamic amplifier circuit employing the present invention; and Fig. 2 is a series of curves illustrating the operation of the circuit of Fig. 1.

In the system shown in the drawings, the invention is applied to an amplifier system including a frequency control tube connected across the amplifier tube and controlled by a feedback circuit fed through a filter network from the common output of the amplifier tube and the control tube. The general effect of such an arrangement is to cause the system to amplify signals of some frequencies more than of other frequencies at selected volume levels. For example if the filter network were of the high pass type, without excessive phase shift in the pass band, then the amplifier as a whole would tend to suppress the high frequency components of an input signal, and could serve as a low pass amplifier. Or if the filter network were of the band pass type, suitably designed as to transmission and phase characteristics, then the amplifier as a whole would tend to emphasize those frequencies outside the band pass range. In general, the amplifier may be termed "degenerative" for frequencies which the filter passes well with little phase shift, "neutral" for frequencies which the filter does not pass, and "regenerative" for frequencies which the filter passes with phase reversal.

The filter network here shown produces a degenerative effect for high and for low frequencies which it passes quite well with little phase shift, but produces a neutral or with some choices of constants a slightly regenerative effect for medium valued frequencies which it passes poorly and with considerable phase shift. In general, therefore, the gain of the amplifier is greater for medium valued frequencies than for high or for low frequencies.

The system also includes an automatic bias control circuit connected to vary the space currents of the amplifier tube and of the frequency control tube in opposite senses. One result is to remove the frequency discrimination effect produced by the control tube for signal levels at which the control tube is caused to be non-conductive.

For example, at low signal levels, the amplifier tube operates at minimum space current but the control tube operates at maximum space current. The effect of a strong degenerative feedback, such as occurs for low and for high frequencies, applied upon the amplifier system by the control tube is then at a maximum, and the signal output for those frequencies is low relative to the signal output of medium frequencies which produces a neutral or slightly regenerative effect. For high signal levels, however, the space current of the amplifier tube becomes a maximum but the space current of the control tube becomes a minimum. Hence the frequency effect of the feedback circuit is reduced or removed entirely, and the amplifier operates independently thereof.

The amplifier tube for which increased volume level causes an increase of space current, operates in general as an expander tube. This increases or multiplies the volume range of the reproduced signal, to compensate for example for the compression introduced in recording, and to produce a desirable increase of contrast between the soft and loud passages.

The general effect of the co-operative action of all parts of the system is to cause the gain-frequency characteristics of the amplifier as a whole to be a suitable function of the input level. This provides a moderate amount of expansion for medium frequencies which are most important musically and which are most free from background disturbances, and at the same time provides a much larger amount of expansion for the very low and very high frequencies for which the musical content is less important at low levels, and for which the background noise content is most conspicuous at low levels. This provides for an amplifier stage of high fidelity at high signal levels, but with most suitable characteristics at low levels, for use with such sound records as must be recorded with deficiency of dynamic range due to the high ratio of noise to signal when the signal is weak.

More specifically the drawing shows a special one stage resistance coupled amplifier, using two dynamic amplifier triodes, 1 and 2, which may be contained in one envelope, with amplifier input terminals 3 and 4 and output terminals 5 and 6. The cathodes of all tubes are heated by filaments not shown, and plate and bias power is supplied from a battery or equivalent source 7. The negative end of the battery 7 is connected to a ground line 8, and the positive end is conductively connected through a resistor 9 to the plates 1*a* and 2*a* of both triodes 1 and 2, and also through a resistor 10 to the cathodes 1*c* and 2*c* of both these triodes. The cathodes 1*c* and 2*c* are conductively connected through main bias resistor 11, and an additional adjustable bias resistor 12, to the ground line 8. The junction of resistors 11 and 12 is connected to the ground line 8 through a series of resistors 14 to 18 associated with one section 19, and also through a series of resistors 20 to 24 associated with another section 25 of a two-section six-position gang switch. For convenience the corresponding switch points or contacts of the two sections 19 and 25 are designated A to F, and the corresponding curves of Fig. 2 are similarly designated. The connections from the various resistors to the switch contacts are as indicated.

It will be understood that as the switch arms are turned by a single control shaft, they will make contact with like designated switch points, and for illustration, they are connected to points designated C. The grid 1*g* of triode 1 is conductively connected through resistor 26 from which it receives its signal voltage, and through resistor 27 from which it receives its automatically variable bias voltage, to the arm of switch section 19, from which it receives a substantially fixed bias which is preset and is invariant during the operation.

Similarly the grid 2*g* of triode 2 is conductively connected through resistor 28 from which it receives its signal voltage, and through resistor 29 from which it receives its automatically variable bias voltage, to the arm of switch section 25 from which it also receives a substantially fixed bias, which is preset and invariant during the operation. The bias due to the D. C. current through cathode resistor 11, which is made up of the currents through the triodes 1 and 2 and the current through the resistor 10 corresponds to normal bias for either triode 1 or 2 for the given circuit condition assuming only one triode is conducting. The total resistance from cathodes to ground through which the cathode to ground current passes and which includes the resistance of resistor 11 and resistance of resistors 14, 15, 16, 17, 18 parallel by resistors 20, 21, 22, 23, 24, corresponds to cut-off bias for either triode assuming only one triode is conducting. Therefore, assuming that there is no D. C. current flow in resistors 26 to 29, then for switch position A, triode 1 is biased at cut off, while triode 2 is normally biased; and for switch position F, the triode 1 is normally biased, while triode 2 is biased at cut-off.

The total D. C. current through the tubes 1 and 2 therefore is substantially the same at both extremes of switch settings and will be nearly the same regardless of the switch position. The rheostat 12 provides for adjusting the bias drop across the switch sections. By-pass capacitor 30 is connected between the cathodes of tubes 1 and 2 and ground line 8 to free this bias system from signal voltage.

For the purpose of producing variable bias by current through the resistors 27 and 29 with D. C. components in the direction indicated by arrows, a pair of rectifiers 31 and 32 are provided, driven by a rectifier driver triode 36 which is actuated from the input terminals 3, 4. These are so connected that the rectified voltages developed by the currents in resistors 27 and 29 are substantially equal, with that through resistor 27 tending to reduce the negative bias of the triode 1, and that through resistor 29 tending to increase the negative bias of triode 2. These automatic changes of bias are in senses corresponding to rotation of the arms of switch sections 19 and 25 in the direction shown. Unidirectional conductor 33 is connected between the junction of resistors 26 and 27 and the junction of resistors 11 and 12, so poled that it passes current only when the bias on tube 1 is less than the normal bias. Also unidirectional conductor 34 is connected from ground line 8 to the junction of resistors 28 and 29, so poled that it passes current only when the bias on tube 2 is greater than the cut off value. These devices 33, 34 in effect limit the changes to bias voltages on the triodes 1 and 2 so that they are always in the cut-off to normal range, and the connection is such that bias variation, either manually by adjustment of the switch, or automatically in accordance with the signal, produces little or no change in the total plate current through resistor 9. As a result, the variation of plate-to-ground voltage of these triodes is that due only to the signal voltages originating at the input terminals 3, 4.

The positive end of battery 7 is connected through resistor 35 to the plate of triode 36, the cathode of which is connected to ground line 8 through cathode resistor 37 paralleled by bypass capacitor 38. The grid of triode 36 is conductively connected to ground line 8 by resistor 39 across which is connected a capacitor 40, and the grid is also connected through capacitor 41 and resistor 42 to tap 43 on a potentiometer 44 bridged between the input terminals 3 and 4. The "hot" terminal 3 is connected by a line 45 to one end of a blocking capacitor 46, the other end of which is connected to the grid side of resistor 26.

Elements 39 to 42 are so chosen that triode 36 is actuated most strongly by signals of frequencies with high acoustic value, that is by energies of frequencies in the middle range to which the human ear is most sensitive. Manually operative tone control for bass and treble adjustment may be included between the input terminals 3, 4 and the grid of triode 1, but these are omitted for purposes of clarity. Thus it is seen that the triodes 1 and 36 are actuated from the same signal source, although not with the same treatment of signals of different frequency ranges.

The plate of triode 36 is connected by a line 47 through capacitors 48 and 49 to the anode of rectifier 31 and the cathode of rectifier 32. Resistors 50 and 51 are connected from the anode and cathode of rectifier 31 respectively, to a line 54a which is connected to the switch arm of switch section 19. Resistors 52 and 53 are connected from the cathode and anode of rectifier 32 respectively, to a line 54b which is connected to the switch arm of switch section 25. The cathode of rectifier 31 is connected through resistor 55 to the junction of resistors 26 and 27, and the anode of rectifier 32 is connected through resistor 56 to the junction of resistors 28 and 29. The resistors 51, 27, 53 and 29 are paralleled by filtering capacitors 57, 58, 59 and 60. The switch lines 54a and 54b may be connected to ground line 8 by capacitors 61 and 62.

This arrangement provides for developing the automatically changing biases for triodes 1 and 2 in accordance with the strength and frequency distribution of the input signal at terminals 3 and 4. The plates of triodes 1 and 2 are connected through blocking condenser 63, line 64 and an output volume control potentiometer 65 to ground line 8. The variable tap 66 of the volume control potentiometer is connected to output terminal 5, and the ground line is connected to output terminal 6. The junction of line 64 and volume control potentiometer 65 is connected through capacitors 67 and 68 in series, paralleled by respective resistors 69 and 70 in series, to one end of blocking capacitor 71, the other end of which is connected to the grid side of resistor 28. The junction of capacitors 67 and 68 is connected to ground line 8 through resistor 72 and the junction of resistors 69 and 70 is connected to ground through capacitor 73. This provides a common output circuit for the dynamic amplifier triodes 1 and 2, and a feedback connection through a network with frequency characteristics to the grid of the triode 2.

Effectively the circuit provides a high pass T network connected in parallel with a low pass T network for providing greater degeneration of high signal frequencies corresponding to scratch type background noise and low signal frequencies corresponding to rumble and hum type background noise.

For a proper physical understanding of the operation of this circuit, the tube 2 here designated the frequency control tube, may be thought of as an electronic impedance shunted across the amplifier tube 1 and its external load. In general, this may have a positive or negative resistance component, and an inductive or capacitive component, the values depending upon the tube characteristics, and the ratio of the A. C. voltage on the grid to the A. C. voltage on the plate of the tube which is determined by the circuit externally connected to the tube. For example, it is well known that with certain relations between the constant of the feedback network, there can be one frequency which the network does not transmit, making the A. C. grid voltage of tube 2 of zero value. In this case, the effective impedance of tube 2 is its internal resistance, producing a mild shunting effect only. However, for very high frequencies making capacitors 67 and 68 of negligible impedance, the plate and grid of tube 2 are electrically connected together for A. C. purposes, and the effective impedance of the tube 2 is a positive resistance, but only a small fraction of the internal resistance of the tube. At very low frequencies making capacitors 67, 68, 73 of very high impedance, the plate and grid of tube 2 are connected through a resistance type network, so that their voltages are in phase, with the grid voltage less than the plate voltage, so that the shunting effect is not so great as at very high frequencies. For medium frequencies, with the network chosen for broad band reduction, the grid voltage may be relatively small, and differ from the plate voltage by values ranging from zero to more than ninety electrical degrees, producing an inductive or capacitive shunting effect, in combination with a positive or negative resistance shunting effect. It will be understood that the constants of the system will be chosen such that any regeneration will occur only for frequencies with small feedback, resulting in stable non-oscillatory operation.

As an example of operation, let the switches 19 and 25 be set at A, corresponding to minimum space current for tube 1 and maximum for tube 2. Then the gain of the amplifier system from terminals 3, 4 to 5, 6 with weak signals may be as shown by curve A of Fig. 2, with quite sharp discrimination against high and low frequencies. Thus the output voltage might equal the input voltage only near the central frequency of 800 cycles. But if the switches are set at position F, corresponding to maximum space current for tube 1 and minimum for tube 2, then the gain characteristics of the system, shown by curve F of Fig. 2 will be uniform and high, since tube 2 is of infinite impedance, and the feedback network can be chosen with high impedance in comparison with the internal resistance of tube 1. Now let the switches be set at an intermediate position say C as shown in the figure, so that both tubes pass current. Curve C of Fig. 2 shows the corresponding gain characteristic for weak signals. If the signal level is increased, causing an increase of the direct currents through resistors 27 and 29, then the bias values and space currents of the tubes will change in a sense corresponding to movement of the switches through positions D, E and F. Thus, although the setting C is fixed, nevertheless the input signal causes the gain-frequency characteristics to be those corresponding to D, E, F of Fig. 2. When the condition of curve F has been reached, further increase of signal does not change the bias and plate current values, since the devices 33 and 34 then pass current, holding the output of the rectifier system very effectively at fixed values.

It is therefore seen that this system provides a suitable small amount of expansion on medium audio frequencies which are highly important acoustically and musically, and are relatively free from background noise disturbances, but a suitable large amount of expansion or high and low frequencies with large amounts of background noise. This provides for high fidelity amplification at high signal levels, and adequate fidelity at lower signal levels, and high quality of reproduction at all levels.

It will be understood that other networks may be substituted for the six element RC type band reducing feedback network shown in the figure. Networks with less emphasis on low pass feedback may be used for systems in which low frequency background noises are of less importance. Or networks using inductors in place of resistors, or conventional band elimination LC filter units may be used. In some applications of the invention, it may be desirable to use degenerative feedback only at a central frequency instead of at high and low frequencies, and it may be desirable in some applications to provide that increased signal shall decrease the general gain. To assist in the design of specific circuits for particular needs, it is desirable to have available a general formula expressing the invention, and this will cover the gain characteristic from input terminals to output terminals, with the output volume control set at maximum. This formula is readily obtained if the reasonable assumption is made that capacitors 46 and 63 are chosen of negligible impedance, so that the input voltage corresponds to the voltage on the grid of tube 1, and the output voltage for maximum potentiometer setting corresponds to the plate voltages of tubes 1 and 2. Then the gain characteristic for a stable condition is;

$$\text{Gain}=\left[\frac{-\gamma_1}{Y+(\alpha+j\beta)\gamma_2}\right]$$

in which, $\gamma_1$ and $\gamma_2$ are the "grid to plate conductances," of triodes 1 and 2, derivable from the static characteristics, at the operating voltages.

Y is the admittance of the system for a signal externally applied between plates of the tubes and ground, assuming the tubes are replaced by simple resistors of values equal to the "internal resistance" of the tubes, with grids not actuated by signals.

$(\alpha+j\beta)$ is the ratio of the grid voltage on tube 2 to the plate voltage on tubes 1 and 2, computable from the constants of the intervening network elements.

By reference to the gain equation, it is seen that the invention of Fig. 1 provides for modulating the gain-frequency characteristics of single stage, single ended, resistance coupled amplifier, by varying the conductances $\gamma_1$ and $\gamma_2$ in opposite senses in accordance with the increase and decrease of the volume level of the input signal during playing of a sound record. The feedback factor $(\alpha+j\beta)$ remains a fixed function of frequency. Moreover the admittance factor Y is quite constant during operation, since the internal resistances of triodes 1 and 2 vary in opposite senses. This admittance factor is of low phase angle, since the only element contributing to a phase shift is the impedance looking backward from the output potentiometer 66 toward the feedback network, and this can be readily designed with high impedance elements.

As a specific example, a system for phonograph reproduction may be designed according to the following specifications: For the dynamic triodes 1 and 2, the 6SN7–GT tube is satisfactory, using supply source 7 of 250 volts, feed resistor 9 and bleeder resistor 10 of 27,000 ohms, and the cathode to ground circuit chosen to provide initial settings of cathode currents running from 0 to 4.3 ma. Two 6H6 tubes are suitable for supplying the rectifiers and unidirectional conductors 31 to 34. The grid resistors 26 and 28 may be 470,000 ohms, and the control circuit filtering resistors 51, 53, 55, 56, 27, 29 may be 270,000 ohms. Suitable timing for speech is obtained by use of capacitors 57 to 60 of 0.25 microfarad value, but for most music, about 1.0 microfarad should be connected between the anode of 33 and the cathode of 34. For the feedback circuit with output potentiometer about 100,000 to 250,000 ohms, capacitors 67 and 68 could be about .0007 microfarad, and resistor 72 about 100,000 ohms; resistors 69 and 70 about 120,000 ohms and capacitor 73 about .05 microfarad. The rectifier driver tube 36 can be a half 6SN7–GT, or 6SL7–GT tube operating as class A to provide equal output to resistors 27 and 29; and the other half tube may be used as a preamplifier. The input circuits should provide about 1 volt A. C. signal to resistor 26 for strongest passages of recordings, yielding about 15 volts output to the volume control 66, with negligible distortion. The input circuits should provide for operation of the devices 33 and 34 when the signal to resistor 26 is about .2 volt. It is economical to locate the bass boost circuit and treble tone circuits between the input terminals 3, 4 and the grid to ground circuit for tube 1. The exact constants for the rectifier driver and other circuits prior to the grid circuit of tube 1 will depend upon the characteristics of the pickup device. In any event, adequate signal and control voltages must be supplied, with discrimination against the very low frequencies and very high frequencies of low acoustical value in the production of control voltages, but without such discrimination in the production of signal voltages.

It will be understood that similar arrangements may be used for other purposes. For example, a multiple channel system using two or more amplifiers in parallel each operating in its own frequency range has been described in U. S. Patent 2,008,825 to John Hays Hammond, Jr. Amplifiers for this purpose might be of the present type, with proper choices of input signals for the dynamic tube 1, the rectifier driver 36, and proper choices of the feedback circuit.

It will be understood that the general arrangement here shown may have other useful applications when the automatic change features are omitted, and the conductances $\gamma_1$, $\gamma_2$ and admittance Y are fixed quantities. For example, a manual tone control system could be readily devised making the feedback factor $(\alpha+j\beta)$ vary as for example by replacing fixed resistor 28 with a potentiometer with the tap connected to the grid of tube 2. This potentiometer could be linked for simultaneous actuation with the volume control 66, and the feedback circuit designed in accordance with any desired relation between the manual volume control setting and the gain-frequency characteristics.

What is claimed is:

1. A selective signal amplifier system comprising a pair of electron tubes, each having at least an anode, a cathode and a control grid, said respective anodes and said respective cathodes being connected together to provide parallel space current paths, a signal input circuit connected between the control grid of the first of said electron tubes and a point of fixed reference potential, a common output circuit connected between said anodes and said point of fixed reference potential, a frequency selective feedback network connected between said output circuit and the control grid of the second of said electron tubes, to provide degenerative feedback for the frequencies most completely passed by said network, signal responsive positive bias means including an impedance device having one end connected to said point of fixed reference potential, said positive bias means being connected between said input circuit and the control grid of the first of said electron tubes, signal responsive negative bias means including an impedance device having one end connected to said point of fixed reference potential, said negative bias means being connected between said input circuit and the control grid of the second of said electron tubes, and a common cathode impedance connected between said cathodes and the other ends of said impedance devices, whereby bias potentials directly proportional to the input signal level are applied in inverse relation to said electron tubes for controlling the effect of said feedback network upon the gain and frequency characteristics of said amplifier system.

2. A selective signal amplifier system as defined in claim 1, in which the feedback network comprises a resistor-capacitor T network having a high-pass characteristic for providing greater degeneration of the high signal frequencies corresponding to high frequency background noise.

3. A selective signal amplifier system as defined in claim 1, in which the feedback network comprises in combination a high-pass T network connected in parallel with a low pass T network for providing greater degeneration of high signal frequencies corresponding to scratch type background noise and low signal frequencies corresponding to rumble and hum type background noise.

4. A selective signal amplifier as defined in claim 1, in which each of said signal responsive bias means includes rectifier elements connected to rectify input signal voltages.

5. A selective signal amplifier as defined in claim 1, including in combination, additional rectifier elements connected between each of said bias means and said cathode impedance in such a polarity to prevent the bias potentials applied to said grids from exceeding the normal range.

6. A selective signal amplifier as defined in claim 1, in which said bias means impedance devices each include mechanically ganged variable resistive elements for adjusting the operating point of each of said electron tubes.

7. A selective signal amplifier system of the type comprising a pair of electron tubes having a common cathode impedance and a common anode load impedance, each of said electron tubes having a control grid, a signal input circuit coupled to the control grid of the first of said tubes and ground for applying input signal voltages to the first of said electron tubes, a frequency selective degenerative feedback network connected between said anode load impedance and the control grid of the second of said electron tubes, signal responsive bias means connected to said signal input circuit and having a positive bias potential terminal and a negative bias potential terminal and a common ground terminal, circuit means connected between said positive bias potential terminal and the control grid of the first of said electron tubes, circuit means connected between said negative terminal and the control grid of the second of said electron tubes, and circuit means connected between said common ground terminal and said common cathode impedance.

8. In a selective signal amplifier comprising two electron tubes having anodes and cathodes connected in parallel, and a common output circuit, means for connecting the grid of one of said electron tubes to a source of signal energy to be selectively amplified, means for degeneratively connecting the grid of the other electron tube to the common output circuit except at the frequencies to be selectively amplified, signal responsive bias means having a positive and a negative bias potential terminal, said bias means being connected to said source of signal energy, means connecting said positive bias potential terminal to the first one of said grids, and means connecting said negative bias potential terminal to the other of said grids, whereby inverse bias potentials directly proportional to said input signal level are applied to said grids for selectivity controlling the gain of said amplifier.

ELLISON S. PURINGTON.

REFERENCES CITED

The following references are of record in the file of this patent:

UNITED STATES PATENTS

| Number | Name | Date |
|---|---|---|
| 1,931,596 | Wheeler | Oct. 24, 1933 |
| 2,148,030 | McLennan | Feb. 21, 1939 |
| 2,173,426 | Scott | Sept. 19, 1939 |
| 2,245,365 | Riddle, Jr. | June 10, 1941 |
| 2,261,335 | Braden | Nov. 4, 1941 |
| 2,262,846 | Herold | Nov. 18, 1941 |
| 2,363,985 | Moser | Nov. 28, 1944 |